US011644518B2

(12) United States Patent
Ham et al.

(10) Patent No.: US 11,644,518 B2
(45) Date of Patent: May 9, 2023

(54) COMPENSATION OF MAGNETIC FIELD COMPONENTS CAUSED BY A PERIODIC MOTION OF A COLD HEAD

(71) Applicant: KONINKLIJKE PHILIPS N.V., Eindhoven (NL)

(72) Inventors: Cornelis Leonardus Gerardus Ham, Oirschot (NL); Filips Van Liere, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 484 days.

(21) Appl. No.: 16/475,469

(22) PCT Filed: Jan. 12, 2018

(86) PCT No.: PCT/EP2018/050713
§ 371 (c)(1),
(2) Date: Jul. 2, 2019

(87) PCT Pub. No.: WO2018/130632
PCT Pub. Date: Jul. 19, 2018

(65) Prior Publication Data
US 2021/0132167 A1    May 6, 2021

(30) Foreign Application Priority Data

Jan. 12, 2017 (EP) .................................... 17151189

(51) Int. Cl.
*G01V 3/00* (2006.01)
*G01R 33/38* (2006.01)
(Continued)

(52) U.S. Cl.
CPC ..... *G01R 33/3804* (2013.01); *G01R 33/3815* (2013.01); *G01R 33/3875* (2013.01); *G01R 33/56563* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 6,229,311 B1 *  5/2001  Abenaim ............... G01R 33/28
                                                           324/318
6,864,682 B2 *  3/2005  Fontius ............... G01R 33/389
                                                           324/309
(Continued)

FOREIGN PATENT DOCUMENTS

JP        10165388 A      6/1998
WO     2009150576 A1    12/2009

OTHER PUBLICATIONS

Anonymous "Cryocooler" Wikipedia Feb. 29, 2016.
International Search Report From PCT/EP2018/050713 dated May 4, 2018.

*Primary Examiner* — Walter L Lindsay, Jr.
*Assistant Examiner* — Frederick Wenderoth (57) ABSTRACT

The present invention provides a method for compensation of periodic $B_0$ modulations from a periodic motion of a cold head (212) of a main magnet (114) of a magnetic resonance (MR) imaging system (110), whereby main windings (200) of the main magnet (114) are cooled to superconductivity by the cold head (212), which exerts a repetitive motion, the method comprising the steps of measuring a periodic occurrence of spatial field components of the B-field based on a motion of the cold head (212) as a function of time, performing a sensor measurement of a periodic, auxiliary parameter of the MR imaging system (110), which is not the periodic occurrence of spatial field components, synchronizing the periodic occurrence of spatial field components of the B-field with the measured periodic, auxiliary parameter of the MR imaging system (110), and triggering based on the
(Continued)

measured periodic sensor measurement of the MR imaging system (110) a periodic application of compensation signals to compensate the periodic occurrence of spatial field components of the B-field based on a motion of the cold head (212). Furthermore, the present invention provides a MR imaging system (110) for providing an image representation of a region of interest (142) of a subject of interest (120) positioned in an examination space (116) of the MR imaging system (110), wherein the MR imaging system (110) is adapted to perform the above method.

13 Claims, 6 Drawing Sheets

(51) Int. Cl.
  *G01R 33/3815* (2006.01)
  *G01R 33/3875* (2006.01)
  *G01R 33/565* (2006.01)

(58) Field of Classification Search
  USPC .......................................................... 324/309
  See application file for complete search history.

(56) References Cited

U.S. PATENT DOCUMENTS

| | | | |
|---|---|---|---|
| 7,170,377 | B2 | 1/2007 | Jiang et al. |
| 2001/0013778 | A1 | 8/2001 | Tsuda |
| 2004/0032260 | A1 | 2/2004 | Fontius et al. |
| 2006/0076954 | A1* | 4/2006 | Kimmlingen ........ G01R 33/389 324/320 |
| 2007/0088211 | A1* | 4/2007 | Cheng .................... A61B 5/055 600/410 |
| 2009/0206839 | A1 | 8/2009 | Seeber et al. |
| 2014/0325999 | A1 | 11/2014 | Hope |
| 2015/0374287 | A1* | 12/2015 | Vahala .................. A61B 5/055 600/411 |

\* cited by examiner

COMPENSATION OF MAGNETIC FIELD COMPONENTS CAUSED BY A PERIODIC MOTION OF A COLD HEAD

CROSS REFERENCE TO RELATED APPLICATIONS

This application is a U.S. national phase application of International Application No. PCT/EP2018/050713 filed on Jan. 12, 2018, which claims the benefit of EP Application Serial No. 17151189.2 filed on Jan. 12, 2017 and is incorporated herein by reference.

FIELD OF THE INVENTION

The invention relates to the field of magnetic resonance (MR) examination systems, in particular to the field of superconductive magnets for MR examination systems, still more particular to the field of compensation of periodic $B_0$ modulations from a periodic motion of a cold head of a main magnet of a magnetic resonance (MR) imaging system, whereby main windings of the main magnet are cooled to superconductivity by the cold head, which exerts a repetitive motion. Even more particular, the invention refers to the field of MR imaging systems for providing an image representation of a region of interest of a subject of interest positioned in an examination space of the MR imaging system.

BACKGROUND OF THE INVENTION

A magnetic resonance (MR) examination system comprises a main magnet with a cryogenic vessel, in which main magnet coils of the main magnet, which is a superconductive magnet, are mounted. The cryogenic vessel typically comprises two or three individual vessels and a mounting structure. In a typical design of the magnet, the cryogenic vessel comprises three individual vessels, which are mounted spaced apart to achieve thermal isolation. The individual vessels are mounted in a surrounding manner from an inner vessel to an outer vessel, and the mounting structure is located within the vessels. E.g. the three vessels can be an inner vessel, also referred to as 4K vessel when helium is used as cryogen, a radiation shield, which is provided as an intermediate vessel surrounding the inner vessel, and an outer vessel, also referred to as 300K vessel, surrounding the radiation shield. The main magnet coils, also referred to as main windings, of the superconductive magnet are located within the inner vessel and mounted to the mounting structure. Hence, the main magnet coils are typically mounted at an inner side of the inner vessel. Further magnet coils can be provided e.g. at an outer side of the inner vessel, e.g. as shield coils. The vessels are usually made of stainless steel or aluminum. The inner vessel contains the cryogen, e.g. liquid helium, which cools the main magnets and also enables heat buffering. Such a superconductive magnet is e.g. known from U.S. Pat. No. 7,170,377 B2.

There are typically two ways to keep the main magnet coils at superconducting temperature. In the first way, the superconducting coils are in contact with the cryogen. The cryogen is typically provided as liquid having a low boiling temperature, e.g. a boiling temperature of about 4.2 K in case of helium, which already evaporates when small amounts of heat enter. A cold head is provided to extend into the inner vessel to re-condense evaporated helium within the inner vessel. Hence, temperature of the cryogen can be reduced to enable efficient cooling of the cryogen and thereby of the main coils of the main magnet. In the second way, the superconducting coils are directly cooled from a cold head, e.g. via copper strands.

The cold head comprises a cold head displacer, which exerts a repetitive motion. The cold head displacer moves up and down, thereby inducing vibrations into the cryogenic vessel. The cold head displacer typically performs the movement at a rate e.g. of 1/50 of a mains frequency of a power supply of the MR imaging system, i.e. the cold head displacer performs a movement at a rate 50 times lower that the mains frequency. This displacement results in a field modulation with a repetition time of e.g. 1 s or 0.83 s, depending on the mains frequency being 50 Hz or 60 Hz, respectively, in accordance with the cold head motion. This repetitive field modulation affects signal quality of acquired MR imaging signals.

The cold head can be shielded, for instance with superconducting material. Despite this shielding, the field modulation in the imaging volume is too big for some types of MR imaging scans. For those scans, the cold head displacer has to be shut down, which is achieved using a by-pass unit in a compressor driving the cold head displacer. Hence, the main magnet cannot be actively cooled during the acquisition of those MR imaging signals, which leads to a temperature increase in the cryogen.

The U.S. Pat. No. 6,864,682 is concerned with correction for magnetic field fluctuations generated due to the cryohead of a superconducting magnet.

SUMMARY OF THE INVENTION

It is an object of the invention to provide a method for compensation of periodic $B_0$ modulations from a periodic motion of a cold head of a main magnet of a magnetic resonance imaging system, whereby main windings of the main magnet are cooled to superconductivity by the cold head, which exerts a repetitive motion, and a magnetic resonance imaging system for providing an image representation of a region of interest of a subject of interest positioned in an examination space of the MR imaging system, which enable an improved, continuous operation of the magnetic resonance imaging system with enhanced magnetic resonance signal acquisition of magnetic resonance imaging signals, in particular with reduced influence of periodic $B_0$ modulations from a periodic motion of a cold head.

This object is achieved by a method for compensation of periodic $B_0$ modulations from a periodic motion of a cold head of a main magnet of a magnetic resonance (MR) imaging system, whereby main windings of the main magnet are cooled to superconductivity by the cold head which exerts a repetitive motion, the method comprising the steps of accessing a periodic occurrence of spatial field components of the $B_0$-field based on a motion of the cold head as a function of time, performing a sensor measurement of a periodic, auxiliary parameter of the MR imaging system, which is not the periodic occurrence of spatial field components, synchronizing the periodic occurrence of spatial field components of the main magnet's stationary magnetic field (B-field) with the measured periodic, auxiliary parameter of the MR imaging system, and triggering based on the measured periodic sensor measurement of the MR imaging system a periodic application of compensation signals to compensate the periodic occurrence of spatial field components of the B-field based on a motion of the cold head. Accessing a periodic occurrence of spatial field components may be done by retrieving stored data, or by measurement of these periodic field components. The measurements may be more or less often repeated to update the stored data.

The periodic occurrence of spatial field components of the $B_0$-field based on a motion of the cold head as a function of time may be measured separately from the actual compensation method. The result of the measurements of the periodic occurrence of spatial field components of the $B_0$-field based on a motion of the cold head as a function of time may be stored to be used in the actual compensation method. The measurements may be carried out at set up of the MRI system, or may be done when the cold head is mounted or replaced. The measurements may also be regularly refreshed. In each of these implementations the method of compensation has access to a stored (representation of) the measured data.

This object is also achieved by software package for a MR imaging system, whereby the software package contains instructions for controlling the MR imaging system according to the above method.

This object is still further achieved by a magnetic resonance (MR) imaging system for providing an image representation of a region of interest of a subject of interest positioned in an examination space of the MR imaging system, wherein the MR imaging system comprises a main magnet and a cold head, whereby main windings of the main magnet are cooled to superconductivity by the cold head, which exerts a repetitive motion, and the MR imaging system comprises measurement means for measuring a periodic occurrence of spatial field components of the B-field based on a motion of the cold head as a function of time, the MR imaging system comprises sensor means for performing a sensor measurement of a periodic, auxiliary parameter of the MR imaging system, which is not the periodic occurrence of spatial field components.

Basic idea of the invention is to provide a simple means for compensation of the periodic $B_0$ modulations from the periodic motion of the cold head. Hence, based on the sensor measurement, a compensation of the cold head movement can be performed. This compensation is based on the periodic behavior of the cold head, which can be determined. Furthermore, the calibration data can be applied merely based on the trigger. A dynamic processing of compensation signals is not required, which makes the compensation rather simple. The compensation signals can be generated once, e.g. when the MR imaging system is set up or when the cold head is mounted or replaced, so that these compensation signals can be applied based on the trigger. However, the compensation signals have to be provided at least once for every new installation. This refers to any installation of the MR imaging system as a whole, as well as e.g. to a replacement or modification of the cold head. The compensation signals can be generated based on a measurement of the magnetic field using the MR imaging system. Similar measurements are e.g. performed for compensation of eddy currents.

The phase of the periodic $B_0$ modulation is determined when measuring the spatial field components of the B-field. Thus, the periodic application of compensation signals leads to repetition of the compensation signals in-line with periodic occurrence of spatial field components of the B-field.

The step of triggering a periodic application of compensation signals based on the measured periodic sensor measurement of the MR imaging system is preferably realized with a control system of the MR imaging system.

In the MR imaging system, the sensor means are provided for performing a sensor measurement of the periodic, auxiliary parameter of the MR imaging system, which is not the periodic occurrence of spatial field components. Different kinds of sensor means can be used to measure different kinds of periodic, auxiliary parameters of the MR imaging system, as will be discussed later on.

The above method provides an efficient but simple means for improving scan quality of the MR imaging system. The field modulation from the periodic movement of the cold head, i.e. the cold head displacer. Hence, the calibration data to compensate the cold head movement, which depends on a movement position of the cold head, can be easily applied, and improvements in the generation of MR scans can be achieved.

As a first improvement, image quality can be improved, since periodic $B_0$ modulations can be compensated for at the time of signal acquisition of the MR imaging system by means of a simple application of calibration data. As a second improvement, since operation of the cold head does not have to be stopped at least for some types of scans, the temperature of the main magnet can be kept at its desired value in a reliable way. Temperature increases due to deactivation of the cold head can be avoided, so that evaporated cryogen can be continuously re-condensed. Hence, a pressure increase in the inner vessel due to dynamic boil-off can be reduced. As a third improvement, since the cold head movement does not have to be interrupted for certain types of MR imaging scan types, a compressor of the cooling system of the MR imaging system can operate continuously. Means for interrupting the operation of the cold head can be omitted, which results in a reduction of used components. Hence, the Bill of Material (BoM) is reduced. For example, a by-pass unit typically used in the compressor to deactivate the cold head movement is not required.

According to a preferred embodiment, the step of performing a sensor measurement of a periodic, auxiliary parameter of the MR imaging system, which is not the periodic occurrence of spatial field components, comprises performing a measurement of the periodic current and/or voltage of a power mains, which powers the MR imaging system, and the step of synchronizing the periodic occurrence of spatial field components of the B-field with the measured periodic, auxiliary parameter of the MR imaging system comprises synchronizing the periodic occurrence of spatial field components of the B-field with a given number of periods of the current and/or voltage of the power mains. The periodic movement of the cold head is coupled to the frequency of the mains voltage, and the periodic movement of the cold head is the basis for the periodic $B_0$ modulation of the magnetic field. Hence, the number of periods of the current and/or voltage of the power mains gives a reliable indication for triggering the periodic application of the compensation signals to compensate the periodic occurrence of spatial field components of the B-field based on the cold head motion. Determining the number of periods of the mains voltage is rather simple, when the cold head movement is exerted with a fix period compared to the period of the mains current/voltage. In this case, the number of periods is an integer value, which has to be defined in the MR imaging system, i.e. the number of periods of the mains voltage for a period of the $B_0$ modulation is a configuration parameter. No measurement is required. The compensation can be applied every number of periods of the mains voltage, that corresponds to the period of the periodic application of compensation signals to compensate the periodic occurrence of spatial field components of the B-field. Hence, a starting point of the periodic $B_0$ modulation is aligned with the mains voltage to determine a synchronization point. The synchronization point enables to align the periodic $B_0$ modulation in the operating MR imaging system with the calibration information based on the mains voltage. Accordingly, the "correct" mains period and phase can be determined to apply the calibration data when performing MR imaging scans. In particular, the synchronization point allows re-synchronization of the mains voltage to the phase of the periodic $B_0$ modulation, e.g. after a power-down of the MR imaging system. Hence, the phase of the periodic $B_0$ modulation can be re-evaluated every time the cooling system and in particular the cold head and/or the compressor are turned on. This is to determine the amplitude as function of time for various field components of the magnetic field. Depending on the kind of sensor used in the determination of the phase of the periodic application of compensation signals to compensate the periodic occurrence of spatial field components of the B-field based on a motion of the cold head, indirect sensor measurements can be used giving mainly a timing relation to be used for synchronization. Preferably, the phase of the periodic $B_0$ modulation is determined between two examinations of the subject of interest, typically two patient examinations.

However, also cold heads with a variable period of the cold head movement compared to the mains frequency are possible. In that case, e.g. a measurement of the period of the periodic $B_0$ modulation compared to a number of periods of the mains voltage can be required. Alternatively, a controller for controlling the cold head movement can provide this value according to its respective setting. A calibration of the field modulations as well as a synchronization of the acquisition of MR imaging signals can be reliably performed after determining the period of the cold head movement. E.g. for a typical cold head with a period of 50 times the period of the mains voltage, the periodic application of compensation signals is repeated every 50 periods, thus maintaining a phase of the periodic $B_0$ modulation compared to the mains voltage. In one possible implementation, the periodic application of compensation signals can be based on a timing relation of the cold head movement, i.e. the displacer, and a system clock of the MR imaging system. The system clock can be used to determine periods of the mains voltage. The compensation is performed e.g. with a modulation of the system frequency $f_0$ for $B_0$ components.

To determine the mains frequency, i.e. a frequency of the voltage and/or current of the power mains, the MR imaging system comprises a voltage sensor and/or a current sensor, respectively, as sensor means. With the voltage sensor and/or a current sensor, the mains frequency of the power mains, which is connected to the MR imaging system, can be determined. In case of a three-phase power mains, the sensor means can be connected to one phase of the power mains. The power mains in this embodiment is provided not only to power the cold head, but also to power other components of the MR imaging system. Hence, the MR imaging system as a whole is connected to the power mains. Accordingly, the mains frequency is available at essentially all locations of the MR imaging system. It is, however, required to synchronize the periodic occurrence of spatial field components of the B-field with a given number of periods of the current and/or voltage of the power mains due to the different period length. Hence, one period out of the periods of the current and/or voltage of the power mains has to be identified to synchronize to the correct phase of the periodic occurrence of spatial field components of the B-field. It is in particular required to clearly identify a synchronization point. It does not matter whether it is a beginning, end, or any other point of the period of the periodic occurrence of spatial field components of the B-field.

According to a preferred embodiment, the method comprises the step of determining a period of the periodic occurrence of spatial field components of the B-field compared to a number of periods of the current and/or voltage of the power mains. E.g. depending on the type of power mains, a mains frequency can be e.g. 50 Hz or 60 Hz. Hence, the cold head displacer typically performs the movement at a rate e.g. of 1/50 of a mains frequency of a power supply of the MR imaging system, i.e. the cold head displacer performs a movement at a rate 50 times lower that the mains frequency. However, in some cases, the cold head performs a periodic motion with a variable frequency. Hence, it is required to clearly identify a relation between the mains frequency and the frequency of the movement of the cold head, i.e. by determining a period of the periodic occurrence of spatial field components of the B-field compared to a number of periods of the mains frequency.

According to a preferred embodiment, the step of performing a measurement of the periodic current and/or voltage of a power mains, which powers the MR imaging system, comprises measuring entire sinusoidal waveforms of the current and/or voltage of the power mains or only zero-crossings of the current and/or voltage of the power mains. Since the cycle of the cold head movement is typically in the range of tens of cycles of the mains frequency, a single cycle of the mains frequency, i.e. the mains voltage or the mains current, only refers to a small fraction of the cycle of the periodic $B_0$ modulation/the periodic motion of the cold head. Hence, determining the zero crossings of the mains voltage provides in general a sufficient resolution to determine a phase of the periodic $B_0$ modulation/the periodic motion of the cold head. However, the phase can be determined even more accurately in case the entire waveform of the mains voltage is detected. A characterization of the magnetic field can be done both in time and/or in space.

According to a preferred embodiment, the step of performing a measurement of the periodic current and/or voltage of a power mains, which powers the MR imaging system, comprises performing a measurement of the periodic current and/or voltage of the power mains in a technical control room of the MR imaging system. The power mains is typically provided not only to power the cold head, but also to power other components of the MR imaging system. Hence, it is connected to essentially all components at all locations of the MR imaging system. In particular, locations which are not affected by gradient switching are considered as appropriate to measure the mains voltage. In case different components of the MR imaging system are connected to different power mains, or to different phases of single, multiphase power mains, installation has to be made in a way to provide the mains voltage of the cooling system, which is responsible for the cold head movement, also in the control room. Alternatively, the correct phase can be determined based on a phase of the mains voltage available in the technical control room. However, also other locations away from the main magnet are considered suitable to determine the mains voltage. It is merely required that the respective location is not affected by the gradient switching.

According to a preferred embodiment, the step of performing a sensor measurement of a periodic, auxiliary parameter of the MR imaging system, which is not the periodic occurrence of spatial field components, comprises performing a sensor measurement of a periodic, auxiliary parameter of the MR imaging system having the same period as the periodic occurrence of spatial field components of the B-field. Such a sensor measurement can comprise measurements performed using e.g. a microphone, an accelerometer, or a pressure sensor as sensor means. Some of these sensor means can be used also for different purposes in the MR imaging system. The sensor means are provided for performing a measurement of a parameter, which is directly related to the movement of the cold head. Accordingly, the sensor measurement can directly be used to synchronize with the periodic occurrence of spatial field components of the B-field and to trigger based on the measured periodic sensor measurement of the MR imaging system a periodic application of compensation signals to compensate the periodic occurrence of spatial field components of the B-field based on a motion of the cold head.

According to a preferred embodiment, the step of performing a sensor measurement of a periodic, auxiliary parameter of the MR imaging system, which is not the periodic occurrence of spatial field components, comprises performing a sensor measurement of a periodic, auxiliary parameter of the MR imaging system having the same period as the periodic occurrence of spatial field components of the B-field and performing a measurement of the periodic current and/or voltage of a power mains, which powers the MR imaging system, and the step of synchronizing the periodic occurrence of spatial field components of the B-field with the measured periodic, auxiliary parameter of the MR imaging system comprises synchronizing the periodic, auxiliary parameter of the MR imaging system having the same period as the periodic occurrence of spatial field components of the B-field with a given number of periods of the current and/or voltage of the power mains. In this embodiment, some of the sensor means are essentially directly coupled to the MR imaging system, so that they can perform a sensor measurement of a periodic, auxiliary parameter of the MR imaging system having the same period as the periodic $B_0$ modulations from a periodic motion of the cold head. Hence, these sensors can be used for synchronization without performing measurements of the periodic $B_0$ modulations based on a periodic motion of the cold head. These sensor means enable re-synchronization of the acquisition of MR imaging signals to the periodic $B_0$ modulations from a periodic motion of a cold head, periodic $B_0$ modulations from a periodic motion of a cold head e.g. after a power off of the MR imaging system. Hence, re-synchronization of the mains voltage to the phase of the periodic $B_0$ modulation can be performed without performing measurements of the B-field. Hence, the phase of the periodic $B_0$ modulation can be re-evaluated every time the cooling system and in particular the cold head and/or the compressor are turned on. In order to synchronize the periodic occurrence of spatial field components of the B-field with the measured periodic, auxiliary parameter of the MR imaging system, the sensor means merely determines sensor information indicative of the phase of the movement of the cold head and the respective the periodic occurrence of spatial field components of the B-field with the measured periodic, auxiliary parameter of the MR imaging system. Accordingly, the mains frequency can be synchronized to the periodic occurrence of spatial field components of the B-field with the measured periodic, auxiliary parameter of the MR imaging system based on these sensor means to enable re-synchronization without B-field measurements.

According to a preferred embodiment, the step of periodic generation of compensation signals to compensate the periodic occurrence of spatial field components of the B-field comprises modulating a system resonance frequency $f_0$ and driving a gradient amplifier (X/Y/Z gradients). Hence, a waveform for the $B_0$ field and the linear terms X, Y, and Z can be compensated, which is typically possible with a small effort. The linear field components as defined by the linear terms X, Y, and Z and can be compensated by gradients. Compensation of the periodic $B_0$ modulation is performed by adding a compensation signal based on the measured $B_0$ modulation to a frequency synthesizer. With a full period of the periodic occurrence of spatial field components of the B-field identified, the calibration data can be reliably applied for acquisition of MR imaging signals.

According to a preferred embodiment, the step of measuring a periodic occurrence of spatial field components of the B-field based on a motion of the cold head as a function of time comprises at least one higher order waveform, in particular a second order waveform, the step of periodic generation of compensation signals to compensate the periodic occurrence of spatial field components of the B-field comprises applying higher order shims. Higher order shims are also referred to as HOS. Practically, higher order waveforms than second order waveforms are of less importance, since they have only minor impact on the periodic modulations of the magnetic field caused by the movement of the cold head.

According to a preferred embodiment, the measurement means comprise at least one out of a MR probe and a pick-up coil for measuring the periodic occurrence of spatial field components of the B-field based on a motion of the cold head as a function of time. Hence, different kinds of sensors can be used to determine the phase of the periodic $B_0$ modulation. In principal, also the MR imaging system can be used to determine the phase of the periodic $B_0$ modulation based on the magnetic field information. In addition, the phase of the mains voltage can be determined based on voltage or current measurements. The probe as well as the pick-up coil can be placed at different places within the examination space of the MR imaging system, e.g. on a patient support or attached or integrated to the RF coil. The pick-up coil refers to a receive coil, which can sense a field in one direction, depending on its orientation within the examination space. In an alternative embodiment, multiple probes or pick-up coils are commonly used as sensor. Alternatively, multiple consecutive measurements can be performed using just a single probe or a single pick-up coil to determine field strengths at different locations within the examination space. The probe preferably comprises a fluorine compound with a resonance frequency different than water and typically a small transmitter and receiver. Also other kinds of sensor like e.g. a magnetic sensor or an electric sensor located in vicinity to the cold head can be used as sensor.

According to a preferred embodiment, the measurement means comprise a phantom, and the MR imaging system is adapted to measure the periodic occurrence of spatial field components of the B-field based on a motion of the cold head as a function of time using the phantom. Result of the step of calibrating a magnetic field disturbance distribution of the $B_0$ modulation depending on a displacement position of the cold head is a waveform of the magnetic field disturbance with a duration of one repetition of the cold head for $B_0$ (or $f_0$). Hence, a field modulation is determined as function of time for each field term to be compensated. The calibration data repeats with the period of the periodic $B_0$ modulation. Calibration is preferably based on using a phantom. The phantom can be used to determine effects of the periodic $B_0$ modulation. Measurements are preferably performed in a similar way like measurements for determining responses based on eddy currents.

According to a preferred embodiment, the sensor means for performing a sensor measurement of a periodic, auxiliary parameter of the MR imaging system, which is not the periodic occurrence of spatial field components, comprise at least one out of a group of a microphone, an accelerometer, a pressure sensor, and a current and/or voltage sensor of a power mains of the MR imaging system. The listed sensor means microphone are suitable to determine a cycle of the periodic $B_0$ modulation. Hence, the information can be synchronized with the period of the mains voltage to establish synchronization with the periodic $B_0$ modulation. Typically, the vibrations and sound are generated directly by the periodic movement of the cold head. However, also vibrations can be detected as a sound using a microphone. Even when no exact position of the cold head can be determined, the obtained information is sufficient to identify a trigger point for synchronization relative to the mains voltage. The microphone can be used to determine a sound or vibrations based on the cold head movement. The microphone is preferably held within an examination space of the MR imaging system. The accelerometer detects vibration of components of the MR imaging system based on vibrations induced by the movement of the cold head. Hence, the accelerometer has to be in contact with the MR imaging system, preferably in contact with the cold head. The pressure sensor is preferably provided in a circuit for driving the cold head, so that it can detect variations in the pressure driving the cold head. The cold head is typically driven by compressor.

According to a preferred embodiment, the MR imaging system comprises a data storage for storing a calibration data set, whereby the calibration data set comprises calibration data for periodic application of compensation signals to compensate the periodic occurrence of spatial field components of the B-field based on a motion of the cold head. The data storage is preferably provided as a local data storage of the MR imaging system, in particular of a control unit of the MR imaging system. However, in an alternative embodiment, the data storage is provided as a network data storage or a cloud data storage, which is connected or connectable to the MR imaging system via a network connection and/or an internet connection. The data storage is provided to store calibration data for calibrating a magnetic field disturbance distribution. Furthermore, the data storage may store compensation data to compensate the periodic $B_0$ modulation based on the movement of the cold head.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
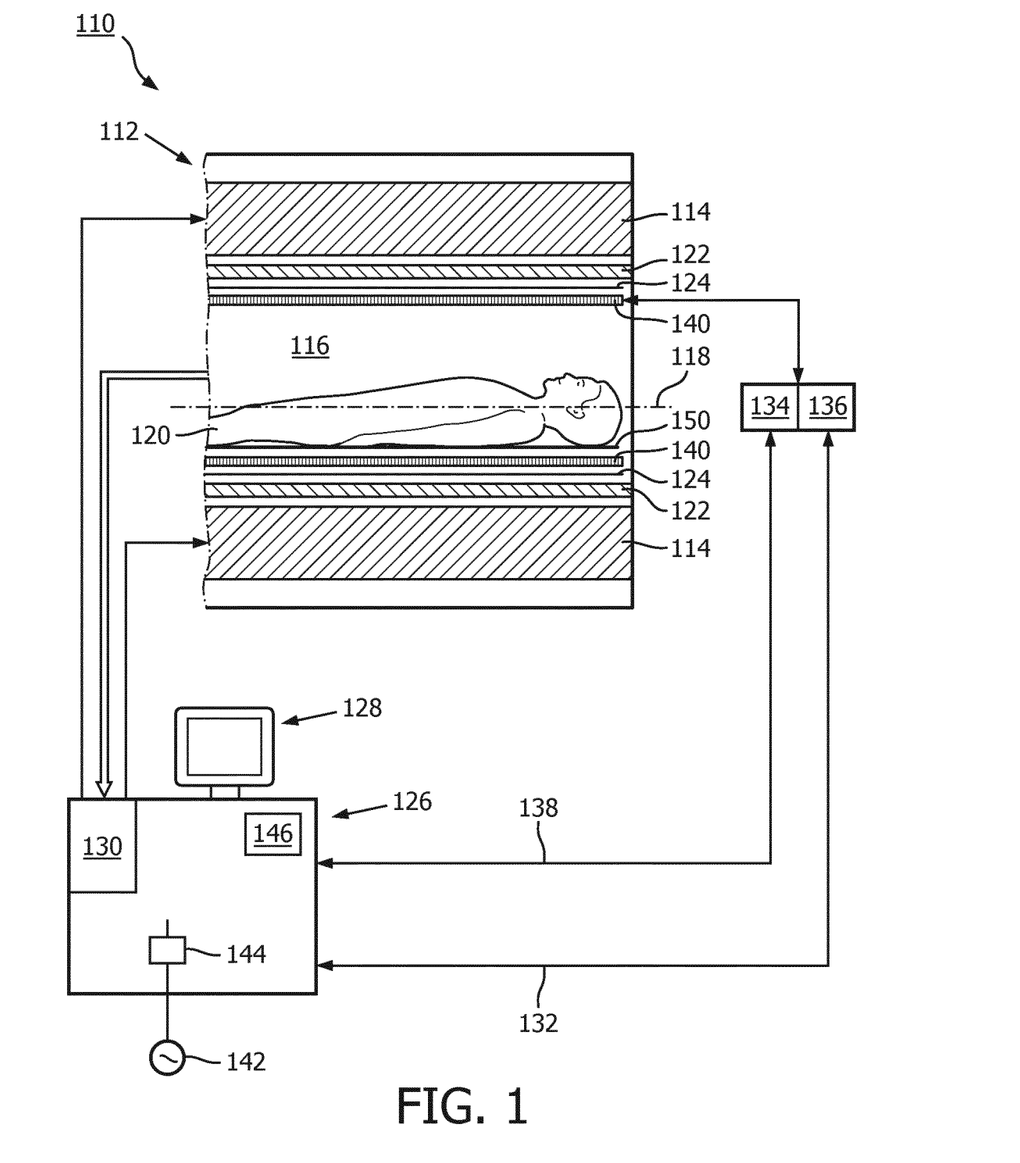
FIG. 1 is a schematic illustration of a part of a first, preferred embodiment of a magnetic resonance (MR) imaging system.

FIG. 1 shows a schematic illustration of a part of an embodiment of a magnetic resonance (MR) imaging system 110 comprising an MR scanner 112 according to a first, preferred embodiment. The MR imaging system 110 is described here generically as a basis for all discussed embodiments.

The MR imaging system 110 includes a main magnet 114 provided for generating a static magnetic field. The main magnet 114 has a central bore that provides an examination space 116 around a center axis 118 for a subject of interest 120, usually a patient, to be positioned within. In this embodiment, the central bore and therefore the static magnetic field of the main magnet 114 have a horizontal orientation in accordance with the center axis 118. In an alternative embodiment, the orientation of the main magnet 114 can be different, e.g. to provide the static magnetic field with a vertical orientation. Further, the MR imaging system 110 comprises a magnetic gradient coil system 122 provided for generating gradient magnetic fields superimposed to the static magnetic field. The magnetic gradient coil system 122 is concentrically arranged within the bore of the main magnet 114, as known in the art. In this embodiment, the subject of interest 120 is located on top of a patient support 150.

Further, the MR imaging system 110 includes a radio frequency (RF) coil 140 designed as a whole-body coil having a tubular body. In an alternative embodiment, the RF coil 140 is designed as a head coil or any other suitable coil type for use in MR imaging systems 110. The RF coil 140 is provided for applying a RF magnetic field to the examination space 116 during RF transmit phases to excite nuclei of the subject of interest 120, which shall be covered by MR images. The RF coil 140 is also provided to receive MR signals from the excited nuclei during RF receive phases. In a state of operation of the MR imaging system 110, RF transmit phases and RF receive phases are taking place in a consecutive manner. The RF coil 140 is arranged concentrically within the bore of the main magnet 114. As is known in the art, a cylindrical RF shield 124 is arranged concentrically between the magnetic gradient coil system 122 and the RF coil 140. Hence, the RF shield 124 coaxially encompasses the RF coil 140. In some embodiments, the RF coil 140 and the RF shield 124 are provided integrally, thereby forming a radio frequency (RF) arrangement 142.

In this context, it is to be noted that the RF coil 140 has been described as transmit and receive coil. Nevertheless, the RF coil 140 can also be provided as transmit or receive coil only.

Moreover, the MR imaging system 110 comprises an MR image reconstruction unit 130 provided for reconstructing MR images from the acquired MR signals and an MR imaging system control unit 126 with a monitor unit 128 provided to control functions of the MR scanner 112, as is commonly known in the art. Control lines 138 are installed between the MR imaging system control unit 126 and a RF transmitter unit 134 that is provided to feed RF power of an MR radio frequency to the RF coil 140 via a RF switching unit 136 during the RF transmit phases. The RF switching unit 136 in turn is also controlled by the MR imaging system control unit 126, and another control line 132 is installed between the MR imaging system control unit 126 and the RF switching unit 136 to serve that purpose. During RF receive phase, the RF switching unit 136 directs the MR signals from the RF coil 140 to the MR image reconstruction unit 130 after pre-amplification.

According to the first embodiment, the MR imaging system 110 is connected to power mains 142 with a given mains frequency. By way of example, only the MR imaging system control unit 126 is shown connected to the power mains 142. Mains frequency of the power mains 142 is typically 50 Hz or 60 Hz, based on national standards. The power mains 142 typically has a mains voltage of 230V or 110V for a single phase, also depending on national standards. A current sensor 144, alternatively a voltage sensor, is provided as measurement means in the control unit 126. The current sensor 144 is coupled to the power mains 142 to sense the mains current with the mains frequency. Furthermore, the control unit 126 comprises a data storage 146 for storing compensation signals, as discussed later on. The data storage 146 according to the first embodiment is provided as a local data storage of the MR imaging system 110 in the control unit 126. In an alternative embodiment, the data storage 146 is provided as a network data storage or a cloud data storage, which is connected or connectable to the MR imaging system 110 via a network connection and/or an internet connection.

Figure 2:
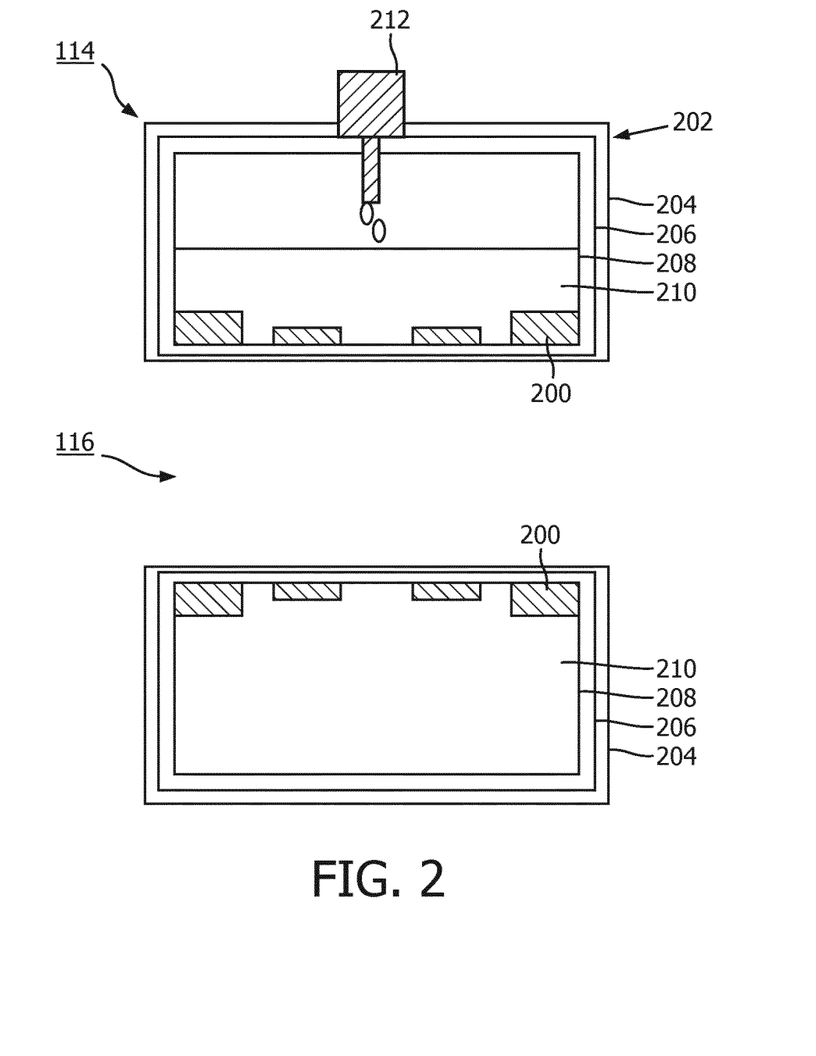
FIG. 2 is a schematic sectional view of a main magnet of the MR imaging system of the first embodiment.

FIG. 2 shows in detail the main magnet 114 of the MR imaging system 110 according to the first embodiment. The main magnet 114 comprises multiple windings 200 or main magnet coils, which are arranged within a cryogenic vessel 202. The main magnet coils 200 are arranged spaced apart along a longitudinal axis of the main magnet 114 and located at a radially inner side of the cryogenic vessel 202. The main magnet 114 of the first embodiment is shown in FIG. 2 with only four main magnet coils 200 for the purpose of illustration only. In alternatives embodiments, the main magnet 114 comprises other numbers of main magnet coils 200. In further alternative embodiments, the main magnet 114 comprises shield coils, which are arranged within the cryogenic vessel 202 at a radially outer side thereof.

The cryogenic vessel 202 according to the first embodiment comprises three individual vessels 204, 206, 208, which are mounted spaced apart to achieve thermal isolation. The individual vessels 204, 206, 208 are mounted in a surrounding manner from an inner vessel 208 to an outer vessel 204. The inner vessel 208 is a 4K vessel, which contains liquid helium 210 as cryogen, a radiation shield 206, which is provided as an intermediate vessel surrounding the inner vessel 208, and an outer vessel 204, also referred to as 300K vessel, surrounding the radiation shield 206. The main magnet coils 200 of the superconductive main magnet 114 are located within the inner vessel 208 and mounted to a mounting structure, which is not shown in the figures. The individual vessels 204, 206, 208 are made of stainless steel and/or aluminum.

As can be further seen in FIG. 2, a cold head 212 is provided extending through the cryogenic vessel 202. According to the first embodiment, the main coils 200 of the main magnet 114 are in contact with the liquid helium 210. The cold head 212 is provided to re-condense evaporated helium 210 in the inner vessel 208. In the first embodiment, the cold head 212 performs a periodic movement with a fix period of the mains voltage. Accordingly, one period of the cold head 212 movement comprises 50 cycles or periods of the mains voltage.

Figure 3:
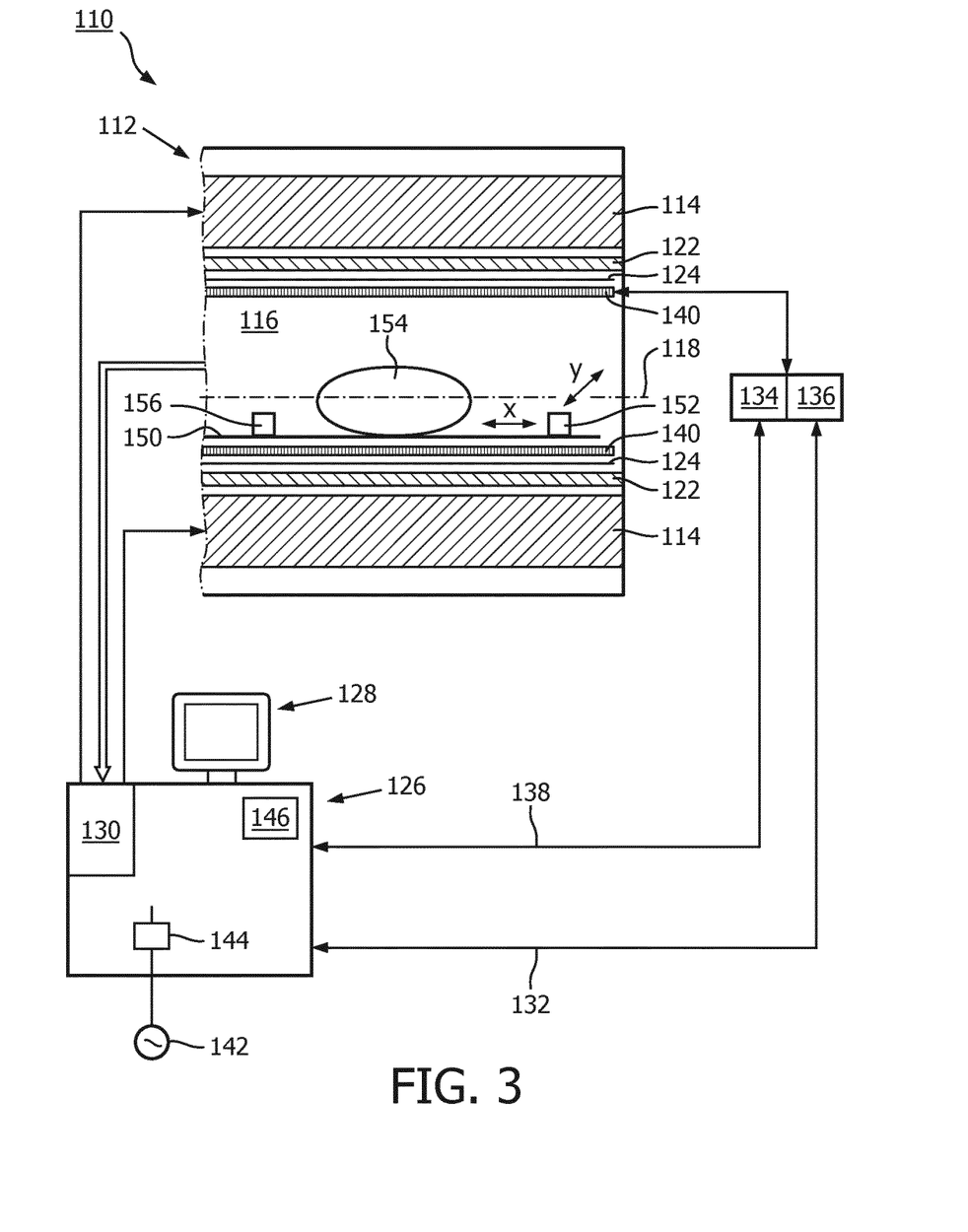
FIG. 3 is a schematic illustration of a part of a second embodiment of a magnetic resonance (MR) imaging system.

FIG. 3 shows a schematic illustration of a second embodiment of a magnetic resonance (MR) imaging system 110. The MR imaging system 110 of the second embodiment is in most aspects identical to the MR imaging system 110 of the first embodiment. Hence, features not discussed in detail with respect to the second embodiment can be understood under consideration of the respective description of the MR imaging system 110 of the first embodiment.

Also according to the second embodiment, the MR imaging system 110 is connected to power mains 142 with a given mains frequency. A current sensor 144 is provided as measurement means in the control unit 126 and coupled to the power mains 142 to sense the mains current with the mains frequency. Furthermore, the control unit 126 comprises a data storage 146 for storing a compensation signal, as discussed later on.

As can be further seen in FIG. 3, the MR imaging system 110 of the second embodiment comprises different types of measurement means 152, 156 for measuring a periodic occurrence spatial field components of the B-field based on a motion of the cold head 212 as a function of time. In particular, the measurement means 152, 156 comprise a MR probe 152 and a pick-up coil 156. The MR probe 152 as well as the pick-up coil 156 are placed on the patient support 150 within the examination space 116 of the MR imaging system 110. The pick-up coil 156 refers to a receive coil, which can sense a field in one direction, depending on its orientation within the examination space 116. The MR probe 152 preferably comprises a fluorine compound with a resonance frequency different than water and typically a small transmitter and receiver. The MR probe 152 and the pick-up coil 156 are moveable on the patient support 150 to perform multiple consecutive measurements using just a single MR probe 152 or a single pick-up coil 156 to determine field strengths at different locations within the examination space 116. FIG. 3 clearly indicates that locations of the MR probe 152 move in X- and Y-direction. However, this also refers to the Z-direction.

In an alternative embodiment, multiple MR probes 152 or pick-up coils 156 are commonly used as measurement means.

As can be further seen in FIG. 3, the MR imaging system 110 is provided with a phantom 154. The imaging system 110 measures the spatial field components of the B-field based on a MR measurement using the phantom 154. The measurements are performed in a similar way like measurements for determining responses based on eddy currents.

Figure 4:
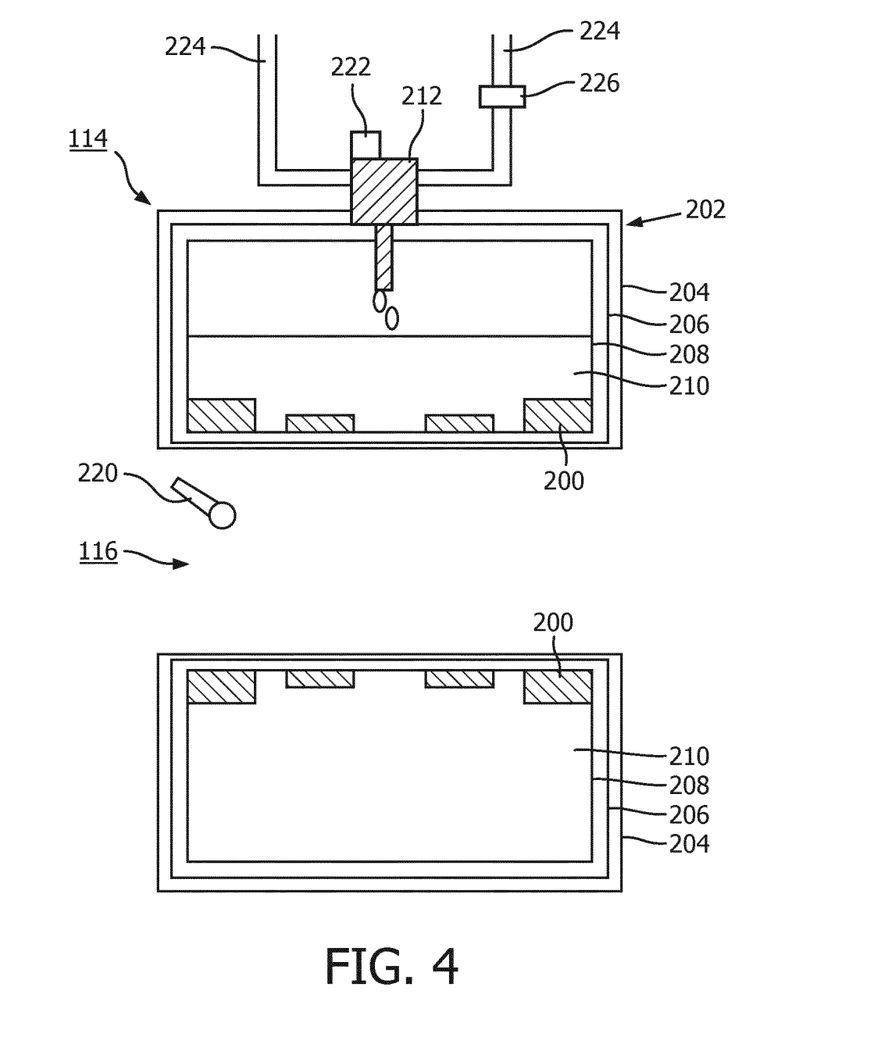
FIG. 4 is a schematic sectional view of a main magnet of the MR imaging system according to a third embodiment.

FIG. 4 shows a schematic illustration of a main magnet 114 of a MR imaging system 110 according to a third embodiment of the magnetic resonance (MR) imaging system 110. The MR imaging system 110 of the third embodiment is in most aspects identical to the MR imaging system 110 of the first and/or second embodiment. Hence, features not discussed in detail with respect to the third embodiment can be understood under consideration of the respective description of the MR imaging system 110 of the first and/or second embodiment.

The general setup of the main magnet 114 is as described above with respect to the main magnet 114 of FIG. 2. As can be seen in FIG. 4 in detail, a cold head 212 is provided extending through the cryogenic vessel 202. The cold head 212 is provided to re-condense evaporated helium 210 in the inner vessel 208. The cold head 212 is driven by a compressor, which is not shown, which circulates liquid helium through tubes 224 to the cold head 212.

As can be seen in FIG. 4, different sensor means 222, 226 for determining a periodic sensor signal with the frequency of the periodic $B_0$ modulation are provided at the cold head 212 or the tubes 224. In particular, the sensor means 222, 226 comprise an accelerometer 222, which detects vibration of components of the MR imaging system 110 based on vibrations induced by the movement of the cold head 212. According to the third embodiment, the accelerometer 222 is attached to the cold head 212. The sensor means 222, 226 further comprise a pressure sensor 226, which is provided along tubes 224. The pressure sensor 226 detects variations in the pressure within the tubes 224.

Furthermore, a microphone 220 is provided within the examination space 116 of the MR imaging system 110 as sensor means. The microphone 220 determines a sound or vibrations based on the cold head 212 movement. In an alternative embodiment, the sensor means 220, 222, 226 comprise other kinds of sensor like e.g. a magnetic sensor or an electric sensor located in vicinity to the cold head 212.

It is to be understood that the different sensor means 220, 222, 226 provide redundant information. Hence, the use of a single type of sensor means 220, 222, 226 is typically sufficient to determine a periodic occurrence of spatial field components of the B-field. However, redundant sensor means 220, 222, 226 can be used to improve the detection of periodic $B_0$ modulation.

Figure 5:
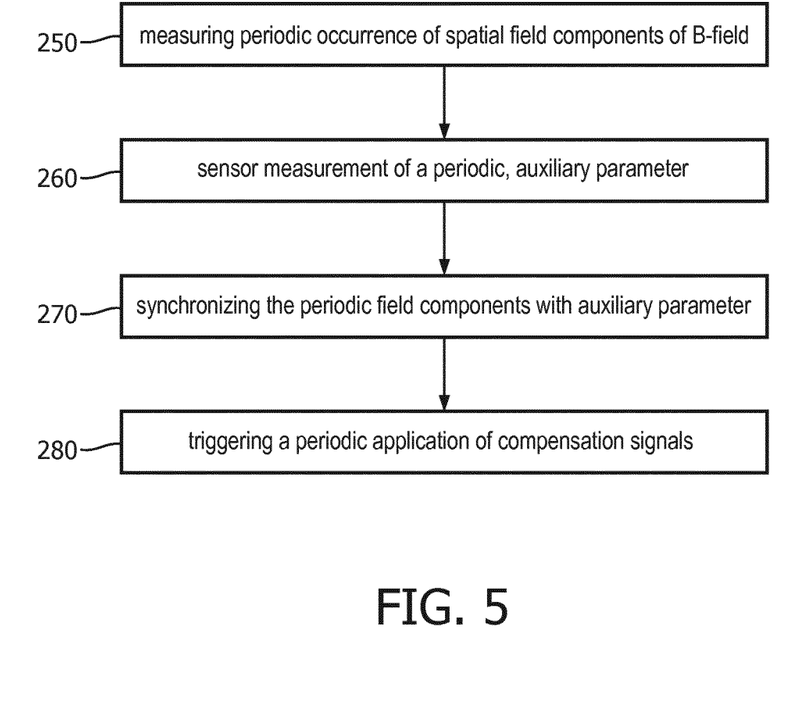
FIG. 5 is a flow chart depicting a method for compensation of periodic $B_0$ modulations from a periodic motion of the cold head of a main magnet of the MR imaging system of the first embodiment.

Subsequently will be described a method for compensation of periodic $B_0$ modulations from a periodic motion of the cold head 212 of the main magnet 114 of the magnetic resonance imaging system 110 according to the first to third embodiment with reference to FIG. 5. Hence, the method is performed using the MR imaging system 110 of one of the first to third second embodiments.

The method starts with step S250, which is measuring a periodic occurrence of spatial field components of the B-field based on a motion of the cold head 212 as a function of time. A period of the periodic $B_0$ modulation can be seen in FIG. 6, upper diagram, which shows an entire period of the periodic $B_0$ modulation. The period of the periodic $B_0$ modulation is approximately 1 s in this embodiment, since the movement of the cold head 212 is coupled to the frequency of the power mains 142 as specified above.

The step of measuring a periodic occurrence of spatial field components of the B-field based on a motion of the cold head 212 as a function of time is performed using the measurement means as discussed above with respect to the second embodiment. Hence, the phantom 154 can be used in the MR imaging system 110, and the MR imaging system 110 is adapted to measure the periodic occurrence of spatial field components of the B-field based on a motion of the cold head as a function of time.

Alternatively, or additionally the MR probe 152 and/or the pick-up coil 156 are used for measuring the periodic occurrence of spatial field components of the B-field based on a motion of the cold head 212 as a function of time. The MR probe 152 as well as the pick-up coil 156 are placed at different places within the RF examination space 116 of the MR imaging system 110, e.g. on a patient support 150 or attached or integrated to the RF coil 140, to perform multiple consecutive measurements to determine magnetic field strengths at different locations within the examination space 116. In an alternative embodiment, multiple MR probes 152 or pick-up coils 156 are commonly used as sensor means.

Based on the measurement of the periodic occurrence of spatial field components of the B-field based on a motion of the cold head 212 as a function of time, compensations signals are calculated for compensation of the measured periodic occurrence of spatial field components of the B-field. The compensation signals are stored in the data storage 146. The compensation signals compensate a waveform of the measured periodic occurrence of spatial field components of the B-field with a duration of one repetition of the cold head 212.

The step S250 of measuring a periodic $B_0$ modulation depends on the installation of the cold head 212 in the MR imaging system 110 and has to be performed at least once for every new installation, including merely replacement or modification of the cold head 212.

Step S260 refers to performing a sensor measurement of a periodic, auxiliary parameter of the MR imaging system 110, which is not the periodic occurrence of spatial field components.

According to the first embodiment, step S260 comprises performing a measurement of the periodic current of the power mains 142, which powers the MR imaging system 110. Hence, a mains frequency of the power mains 142 connected to the MR imaging system 110 is determined. In case of a three-phase power mains 142, the current sensor 144 is connected to one phase of the power mains 142. The current sensor 144 measures entire sinusoidal waveforms of the current of the power mains 142. The current sensor 144 is located in a technical control room of the MR imaging system 110, i.e. away from the main magnet 114 and not affected by the gradient switching.

Figure 6:
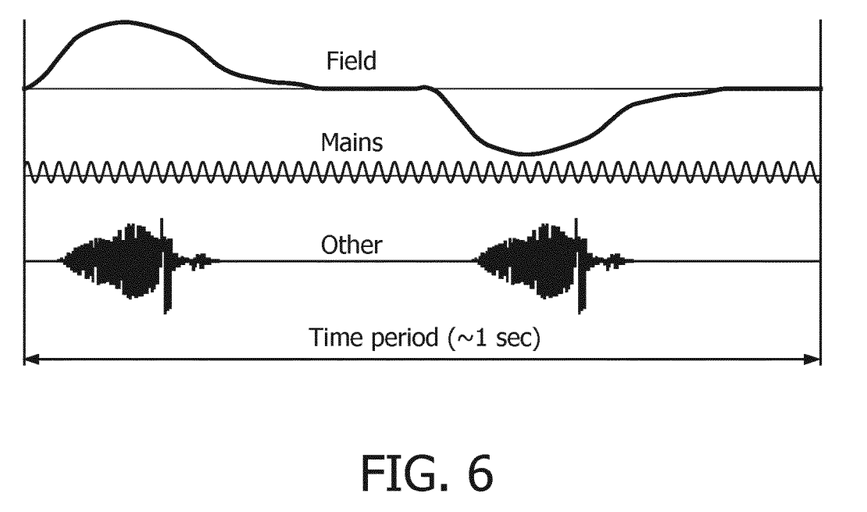
FIG. 6 is a diagram indicating a magnetic field modulation caused by cold head motion together with a sensor signal and a mains voltage according to the first and second embodiments.

Furthermore, a period of the periodic occurrence of spatial field components of the B-field compared to a number of periods of the current of the power mains 142 is determined. For a standard European installation, the mains frequency is 50 Hz, so that the cold head displacer performs its movement at a rate of 1/50 of the mains frequency. The periodic occurrence of spatial field components of the B-field as well as the mains frequency are indicated in FIG. 6.

According to the third embodiment, step S260 comprises performing a sensor measurement of a periodic, auxiliary parameter of the MR imaging system 110 having the same period as the periodic occurrence of spatial field components of the B-field. Hence, sensor signals such a sensor measurement can comprise measurements performed using e.g. the microphone 220, the accelerometer 222, or the pressure sensor 226 as sensor means.

Furthermore, as discussed above with respect to the first embodiment, also according to the third embodiment, step S260 comprises performing a measurement of the periodic current of the power mains 142. Hence, a sensor signal with the same period as the periodic occurrence of spatial field components of the B-field and the periodic current of the power mains 142, which powers the MR imaging system 110, are performed together.

Step S270 refers to synchronizing the periodic occurrence of spatial field components of the B-field with the measured periodic, auxiliary parameter of the MR imaging system 110. According to the first embodiment, the periodic occurrence of spatial field components of the B-field based on a motion of the cold head 212 is directly synchronized to the mains frequency. Hence, one period out of the periods of the current of the power mains 142 is identified to synchronize to the correct phase of the periodic occurrence of spatial field components of the B-field as synchronization point. Subsequently, synchronization is achieved by the mains frequency, i.e. the occurrence of spatial field components of the B-field repeats every 50 mains periods. Hence, first a starting point of the periodic occurrence of spatial field components of the B-field is aligned with the mains frequency, which enables to align the periodic occurrence of spatial field components of the B-field merely based on the mains frequency. Accordingly, the "correct" mains period and phase are determined to identify a phase of the power mains 142.

According to the third embodiment, synchronizing the periodic, an auxiliary parameter of the MR imaging system 110 comprises using a sensor signal from the accelerometer 222, the pressure sensor 226, or the microphone 220, which have the same period as the periodic occurrence of spatial field components of the B-field. According to a modified embodiment, the sensor signal from the accelerometer 222, the pressure sensor 226, or the microphone 220 having the same period as the periodic occurrence of spatial field components of the B-field is further synchronized to the mains frequency, as discussed above with respect to the first embodiment. After power on, the synchronization is performed every time to synchronize the mains frequency to the sensor signal. Hence, the phase of the periodic occurrence of spatial field components of the B-field is re-evaluated every time the cooling system and in particular the cold head and/or the compressor are turned on.

Step S280 refers to triggering based on the measured periodic sensor measurement of the MR imaging system 110 a periodic application of compensation signals to compensate the periodic occurrence of spatial field components of the B-field based on a motion of the cold head 212. The compensation signals compensate the periodic occurrence of spatial field components of the B-field. According to the compensation signals, a system resonance frequency $f_0$ is modulated and a gradient amplifier (X/Y/Z gradients) is driven. Furthermore, also a second order waveform is compensated for by applying higher order shims. The compensation signal is the compensation signal stored in the data storage 146. The compensation signals are applied every 50 periods of the mains frequency, which corresponds to the period of the periodic application of compensation signals to compensate the periodic occurrence of spatial field components of the B-field based on the movement of the cold head 212. Furthermore, the periodic $B_0$ modulation compared to a number of periods of the mains frequency can be seen in FIG. 6 based on the diagram below the periodic $B_0$ modulation in FIG. 6 indicating the mains voltage. The power mains 142 in this embodiment has a frequency of 50 Hz, so that a period of the periodic $B_0$ modulation covers approximately 50 periods of the power mains 142. The mains frequency is measured using the current sensor 144.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST

110 magnetic resonance (MR) imaging system
112 magnetic resonance (MR) scanner
114 main magnet
116 RF examination space
118 center axis
120 subject of interest
122 magnetic gradient coil system
124 RF screen
126 MR imaging system control unit
128 monitor unit
130 MR image reconstruction unit
132 control line
134 RF transmitter unit
136 RF switching unit
138 control line
140 radio frequency (RF) coil
142 power mains
144 current sensor, sensor means
146 data storage
150 patient support
152 MR probe, measurement means
154 phantom
156 pick-up coil, measurement means
200 winding, main magnet coil
202 cryogenic vessel
204 outer vessel, 300K vessel
206 intermediate vessel, radiation shield
208 inner vessel, 4K vessel
210 cryogen, helium
212 cold head
220 microphone, sensor means
222 accelerometer, sensor means
224 tube
226 pressure sensor, sensor means

The invention claimed is:

1. A method for compensation of periodic B0 modulations from a periodic motion of a cold head of a main magnet of a magnetic resonance (MR) imaging system, whereby main windings of the main magnet are cooled to superconductivity by the cold head, which exerts a repetitive motion, the method comprising:

accessing a periodic occurrence of spatial field components of the main magnet's magnetic field (B-field) based on a motion of the cold head as a function of time, performing a sensor measurement of a periodic, auxiliary parameter of the MR imaging system which is not the periodic occurrence of spatial field components, which sensor measurement comprises performing a measurement of the periodic current and/or voltage of a power main with a current or voltage sensor coupled to the power main, which powers the MR imaging system and the periodic movement of the cold head is coupled to the frequency of the mains voltage, synchronizing the periodic occurrence of spatial field components of the B-field with the measured periodic, auxiliary parameter of the MR imaging system, by synchronizing the periodic occurrence of spatial field components of the B-field with a given number of periods of the current and/or voltage of the power mains;

and triggering, based on the measured periodic sensor measurement of the MR imaging system, a periodic application of compensation signals to compensate the periodic occurrence of spatial field components of the B-field based on a motion of the cold head.

2. A magnetic resonance (MR) imaging system for providing an image representation of a region of interest of a subject of interest positioned in an examination space of the MR imaging system, the MR imaging system comprising:
a main magnet and a cold head which exerts a repetitive motion and, configured to cool the main magnet's main windings to superconductivity by the cold head, and
measurement means for measuring a periodic occurrence of spatial field components of the B-field based on a motion of the cold head as a function of time,
sensor means comprising a current sensor or a voltage sensor for performing which sensor measurement comprises performing a measurement of the periodic current and/or voltage of a power main, which powers the MR imaging system.

3. The method according to preceding claim 1, including: determining a period of the periodic occurrence of spatial field components of the B-field compared to a number of periods of the current and/or voltage of the power mains.

4. The method according to claim 1, wherein performing a measurement of the periodic current and/or voltage of a power mains, which powers the MR imaging system, comprises:
measuring entire sinusoidal waveforms of the current and/or voltage of the power mains or only zero-crossings of the current and/or voltage of the power mains.

5. The method according to claim 1, wherein performing a measurement of the periodic current and/or voltage of a power mains, which powers the MR imaging system, comprises:
performing a measurement of the periodic current and/or voltage of the power mains in a technical control room of the MR imaging system.

6. The method according to claim 1, wherein performing a sensor measurement of a periodic, auxiliary parameter of the MR imaging system, which is not the periodic occurrence of spatial field components, comprises:
performing a sensor measurement of a periodic, auxiliary parameter of the MR imaging system having the same period as the periodic occurrence of spatial field components of the B-field.

7. The method according to claim 1, wherein performing a sensor measurement of a periodic, auxiliary parameter of the MR imaging system, which is not the periodic occurrence of spatial field components, comprises:
performing a sensor measurement of a periodic, auxiliary parameter of the MR imaging system having the same period as the periodic occurrence of spatial field components of the B-field and performing a measurement of the periodic current and/or voltage of a power mains, which powers the MR imaging system; and
synchronizing the periodic occurrence of spatial field components of the B-field with the measured periodic, auxiliary parameter of the MR imaging system comprises:
synchronizing the periodic, auxiliary parameter of the MR imaging system having the same period as the periodic occurrence of spatial field components of the B-field with a given number of periods of the current and/or voltage of the power mains.

8. The method according to claim 1, wherein the periodic application of compensation signals to compensate the periodic occurrence of spatial field components of the B-field comprises:
modulating a system resonance frequency f0 and driving a gradient amplifier (X/Y/Z gradients).

9. The method according to claim 1, wherein measuring a periodic occurrence of spatial field components of the B-field based on a motion of the cold head as a function of time comprises at least one higher order waveform; and
the periodic application of compensation signals to compensate the periodic occurrence of spatial field components of the B-field comprises applying higher order shims.

10. A computer program including executable instructions stored on a non-transitory computer readable medium such that when executed by a processor causes the processor to perform a method for compensation of periodic B0 modulations from a periodic motion of a cold head of a main magnet of a magnetic resonance (MR) imaging system, whereby main windings of the main magnet are cooled to superconductivity by the cold head, which exerts a repetitive motion, the method comprising:
accessing a periodic occurrence of spatial field components of the main magnet's magnetic field (B-field) based on a motion of the cold head as a function of time,
performing a sensor measurement of a periodic, auxiliary parameter of the MR imaging system which is not the periodic occurrence of spatial field components, which sensor measurement comprises performing a measurement of the periodic current and/or voltage of a power main with a current or voltage sensor coupled to the power main, which powers the MR imaging system and the periodic movement of the cold head is coupled to the frequency of the mains voltage,
synchronizing the periodic occurrence of spatial field components of the B-field with the measured periodic, auxiliary parameter of the MR imaging system, by synchronizing the periodic occurrence of spatial field components of the B-field with a given number of periods of the current and/or voltage of the power mains; and
triggering, based on the measured periodic sensor measurement of the MR imaging system, a periodic application of compensation signals to compensate the periodic occurrence of spatial field components of the B-field based on a motion of the cold head.

11. The MR imaging system according to preceding claim 2, wherein
the measurement means comprise at least one out of a MR probe and a pick-up coil for measuring the periodic occurrence of spatial field components of the B-field based on a motion of the cold head as a function of time.

12. The MR imaging system according to claim 2, wherein
the measurement means comprise a phantom, and
the MR imaging system is adapted to measure the periodic occurrence of spatial field components of the B-field based on a motion of the cold head as a function of time using the phantom.

13. The MR imaging system according to claim 2, wherein
the MR imaging system comprises a data storage for storing a calibration data set, whereby the calibration data set comprises calibration data for periodic application of compensation signals to compensate the periodic occurrence of spatial field components of the B-field based on a motion of the cold head.

* * * * *